(12) United States Patent
Kobayashi

(10) Patent No.: US 12,106,928 B2
(45) Date of Patent: Oct. 1, 2024

(54) CATHODE MECHANISM OF ELECTRON EMISSION SOURCE, AND METHOD FOR MANUFACTURING CATHODE MECHANISM OF ELECTRON EMISSION SOURCE

(71) Applicant: NuFlare Technology, Inc., Yokohama (JP)

(72) Inventor: Ryoei Kobayashi, Yokahama (JP)

(73) Assignee: NuFlare Technology, Inc., Yokohama (JP)

( * ) Notice: Subject to any disclaimer, the term of this patent is extended or adjusted under 35 U.S.C. 154(b) by 33 days.

(21) Appl. No.: 17/938,466

(22) Filed: Oct. 6, 2022

(65) Prior Publication Data

US 2023/0132046 A1  Apr. 27, 2023

(30) Foreign Application Priority Data

Oct. 26, 2021 (JP) ................................. 2021-174612

(51) Int. Cl.
*H01J 37/065* (2006.01)
*H01J 9/04* (2006.01)
(Continued)

(52) U.S. Cl.
CPC .............. *H01J 37/065* (2013.01); *H01J 9/04* (2013.01); *H01J 9/18* (2013.01); *H01J 37/075* (2013.01);
(Continued)

(58) Field of Classification Search
None
See application file for complete search history.

(56) References Cited

U.S. PATENT DOCUMENTS

| 7,919,750 B2 | 4/2011 | Yasuda et al. |
| 8,456,076 B2 * | 6/2013 | Morishita ............... H01J 37/06 313/341 |
| 2022/0270842 A1 | 8/2022 | Kobayashi |

FOREIGN PATENT DOCUMENTS

| EP | 0 363 055 A2 | 4/1990 |
| JP | 2006-221895 * | 8/2006 |

(Continued)

OTHER PUBLICATIONS

Combined Taiwanese Office Action and Search Report issued Oct. 27, 2023 in Taiwanese Patent Application No. 111130920 (with unedited computer-generated English Translation), 11 pages.

*Primary Examiner* — Ashok Patel
(74) *Attorney, Agent, or Firm* — Oblon, McClelland, Maier & Neustadt, L.L.P.

(57) ABSTRACT

A cathode mechanism of an electron emission source includes a crystal that includes an upper part being columnar, truncated conical, or their combined shape, and having a first surface to emit thermoelectrons, and a lower part, integrated with the upper part, having a second surface substantially parallel to the first surface, and a diameter larger than the maximum diameter of the upper part, a holding part that is a column having, in order from the holding part upper side, different inner diameters of a first diameter and a second diameter larger than the first one, and that holds the crystal in the state where the crystal first surface is projecting from the upper surface, and the crystal second surface contacts the holding part inside the column, and a retaining part that retains the crystal, at the back of the crystal lower part, not to be separated from the holding part.

8 Claims, 16 Drawing Sheets

(51) Int. Cl.
   *H01J 9/18* (2006.01)
   *H01J 37/075* (2006.01)
   *H01J 37/317* (2006.01)

(52) U.S. Cl.
   CPC ..... *H01J 37/3177* (2013.01); *H01J 2237/032* (2013.01)

(56) References Cited

FOREIGN PATENT DOCUMENTS

JP   WO2007/055154 A1   5/2007
   JP   2022-130056 A      9/2022
   TW   I362050 B          4/2012

* cited by examiner

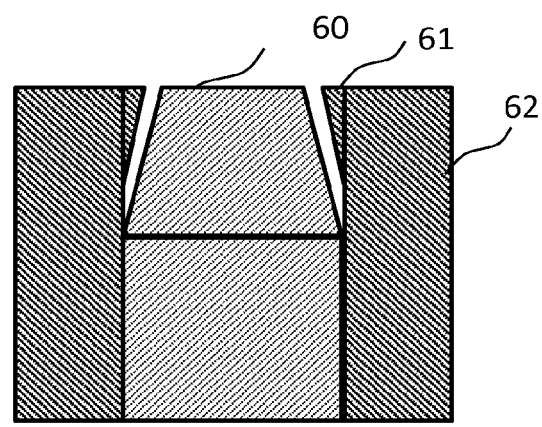
FIG.7A
RETREATING DUE TO BECOMING WORN OUT
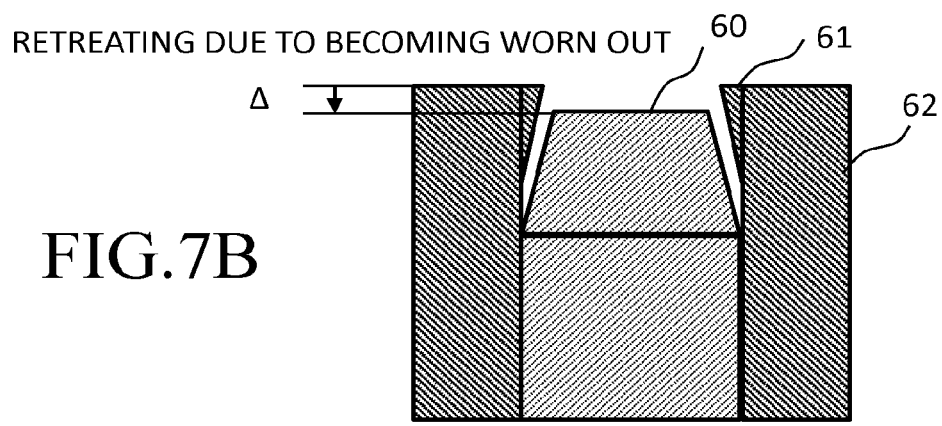
FIG.7B

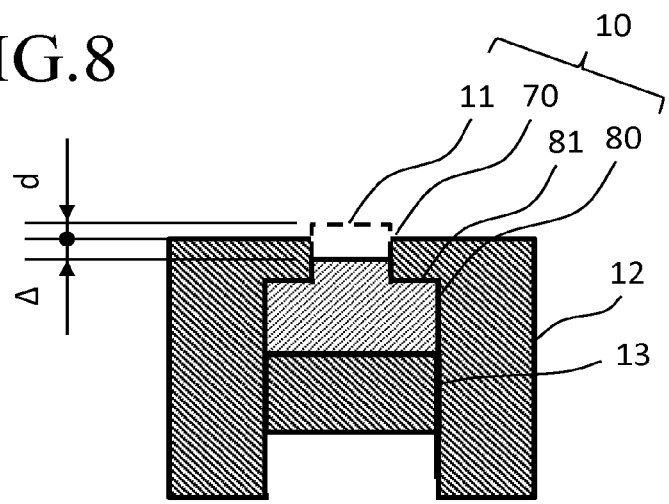

CATHODE MECHANISM OF ELECTRON EMISSION SOURCE, AND METHOD FOR MANUFACTURING CATHODE MECHANISM OF ELECTRON EMISSION SOURCE

CROSS-REFERENCE TO RELATED APPLICATION

This application is based upon and claims the benefit of priority from prior Japanese Patent Application No. 2021-174612 filed on Oct. 26, 2021 in Japan, the entire contents of which are incorporated herein by reference.

BACKGROUND OF THE INVENTION

Field of the Invention

One aspect of an embodiment of the present invention relates to a cathode mechanism of an electron emission source, and a method for manufacturing a cathode mechanism of an electron emission source.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system performs to form multiple beams by letting portions of an electron beam emitted from an electron emission source individually pass through a corresponding one of a plurality of holes in a mask, to provide a blanking control for respective formed beams, to reduce, by an optical system, beams that were not blocked in the blanking process to reduce a mask image, and to deflect, by a deflector, the reduced beams to irradiate a desired position on a target object or "sample".

With respect to a cathode of a thermal electron emission source for emitting electron beams, a crystal whose side surface is covered with a covering material up to the height position flush with the electron emission surface is used (e.g., refer to republished WO 2007/055154). Since the crystal is worn out with use, the electron emission surface retreats compared with the original state. When using a crystal whose side surface is covered with a covering material, if the electron emission surface retreats a predetermined amount from the edge surface of the covering material, a desired brightness distribution is no longer acquired and the life of the cathode reaches the end. When the cathode life reaches the end, it becomes necessary to stop the apparatus each time, and thus, the apparatus operation time becomes short. By contrast, when using a crystal whose side surface is not covered, since electrons are emitted also from the side surface of the crystal, controlling to have a desired brightness distribution is difficult. Therefore, it is required to extend the life of the cathode by which a desired brightness distribution can be acquired.

BRIEF SUMMARY OF THE INVENTION

According to one aspect of the present invention, a cathode mechanism of an electron emission source includes
a crystal configured to include an upper part whose shape is one of a column, a truncated cone, and a combined shape of them, and which has a first surface to emit thermoelectrons by heating, and a lower part, integrated with the upper part, which has a second surface being substantially parallel to the first surface, and having a diameter size larger than a maximum diameter size of the upper part;
a holding part configured to be a column having, in order from a side of an upper surface of the holding part, a plurality of different inner diameters of a first diameter size and a second diameter size larger than the first diameter size, and to hold the crystal in a state where the first surface of the crystal is projecting from the upper surface, and the second surface of the crystal contacts the holding part inside the column; and
a retaining part configured to retain the crystal, at a back side of the lower part of the crystal, not to be separated from the holding part.

According to another aspect of the present invention, a manufacturing method of a cathode mechanism of an electron emission source includes
inserting, into an opening part, a crystal that includes an upper part whose shape is one of a column, a truncated cone, and a combined shape of them and which has a first surface to emit thermoelectrons by heating, and a lower part, integrated with the upper part, which has a second surface being substantially parallel to the first surface and having a diameter size larger than a maximum diameter size of the upper part, wherein the inserting is performed from a back side of a holding part being a column in which the opening part is formed to have, in order from a side of an upper surface of the holding part, a plurality of different inner diameters of a first diameter size and a second diameter size larger than the first diameter size; and
retaining the crystal by a retaining part, at a back side of the lower part of the crystal, not to be separated from the holding part in a state where the first surface is projecting from a tip of the opening part, and, inside the opening part, the second surface of the crystal contacts a surface at which the second diameter size is changed to the first diameter size.

BRIEF DESCRIPTION OF THE DRAWINGS

FIGS. 7A and 7B are illustrations for explaining the life of a cathode according to a comparative example of the first embodiment;

FIG. 8 is an illustration for explaining the life of a cathode according to the first embodiment;

DETAILED DESCRIPTION OF THE INVENTION

In the following, embodiments of the present invention provide a cathode mechanism that can extend the life of the cathode by which a desired brightness distribution can be acquired, and a manufacturing method of the cathode mechanism.

Embodiments below describe a configuration using multiple beams as an electron beam. However, it is not limited thereto. A configuration using a single beam is also preferable. Further, although a writing apparatus is described below, any other apparatus is also preferable as long as it uses electron beams emitted from a thermal electron emission source. For example, it may be an image acquisition apparatus, an inspection apparatus, or the like.

First Embodiment

Figure 1:
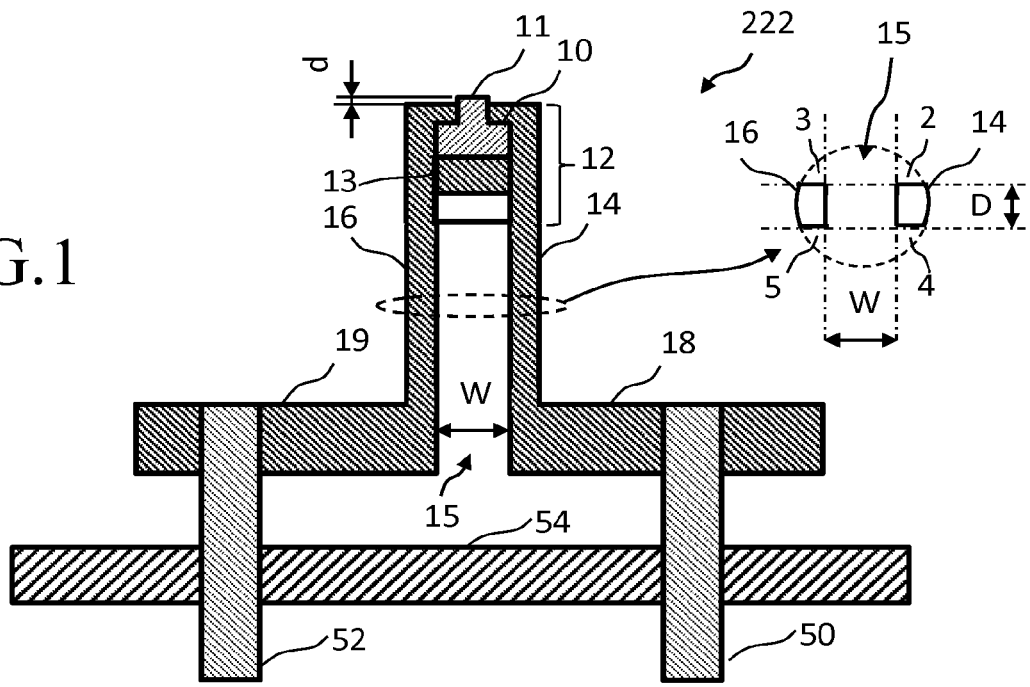
FIG. 1 is a sectional view showing an example of a structure of a cathode mechanism of an electron emission source according to a first embodiment.
Figure 2:
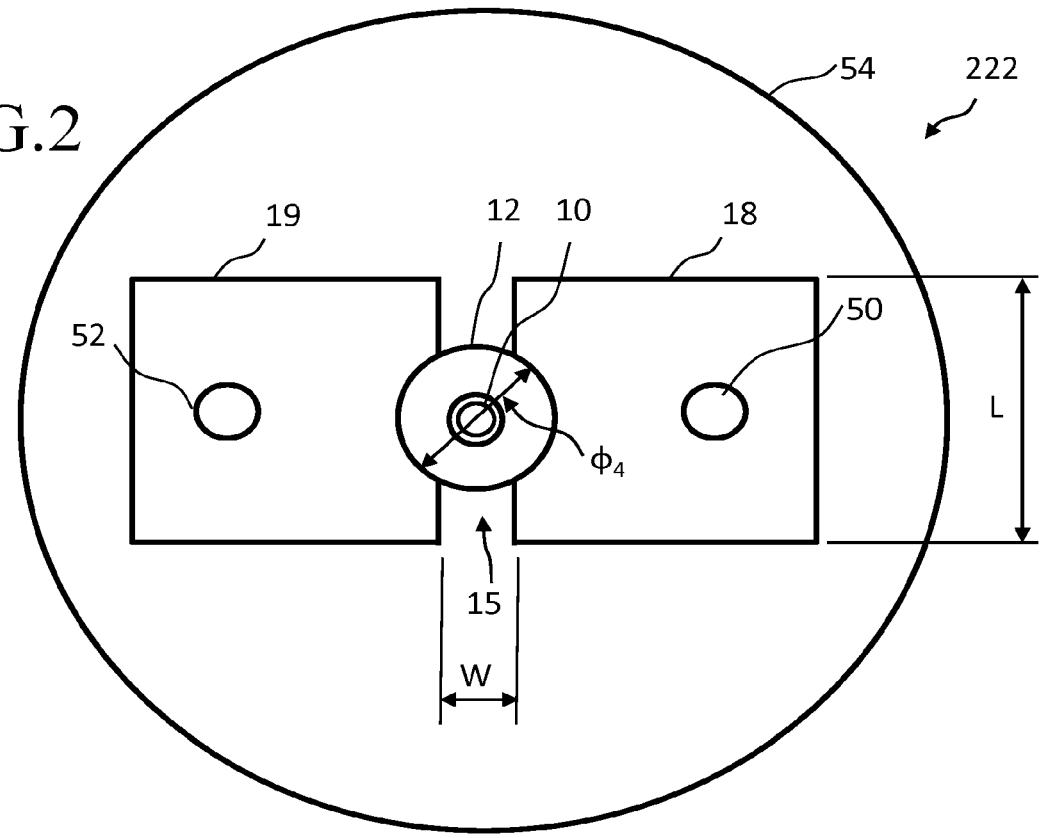
FIG. 2 is a top view showing an example of a structure of a cathode mechanism of an electron emission source according to the first embodiment.
Figure 3:
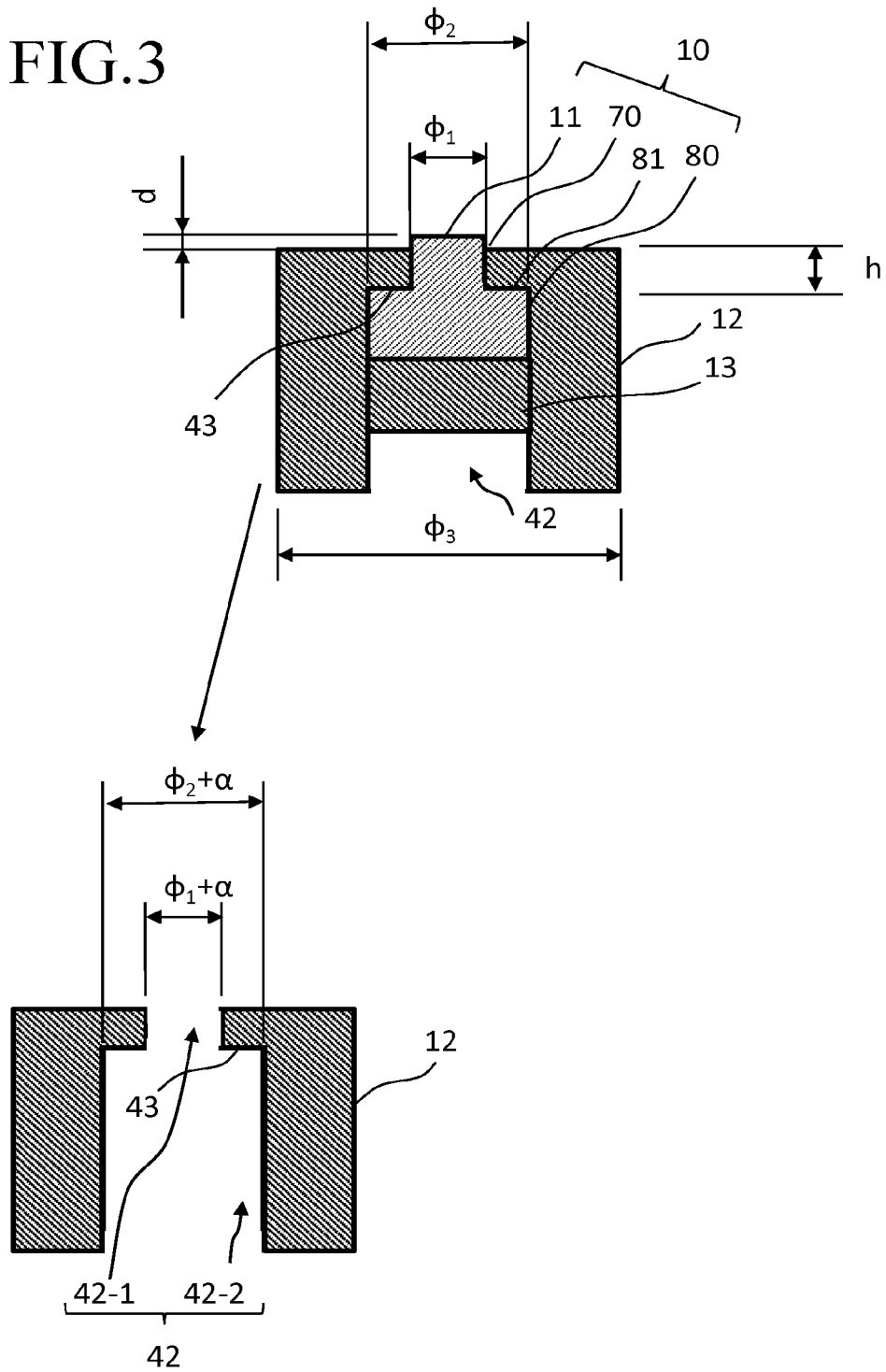
FIG. 3 is an expanded sectional view of an example of a crystal, a holding part, and a retaining part according to the first embodiment.

FIG. 1 is a sectional view showing an example of a structure of a cathode mechanism of an electron emission source according to a first embodiment. FIG. 2 is a top view showing an example of a structure of a cathode mechanism of an electron emission source according to the first embodiment. FIG. 3 is an expanded sectional view of an example of a crystal, a holding part, and a retaining part according to the first embodiment. A cathode mechanism 222 (negative electrode mechanism) of the electron emission source in FIGS. 1 and 2 includes a crystal 10, a holding part 12, a retaining part 13, a pair of supporting posts 14 and 16, and a pair of base parts 18 and 19. The electron emission source 201 includes an electron gun.

By being heated, the crystal 10 emits thermal electrons from an electron emission surface 11 (first surface) being an end surface. As a material of the crystal 10, lanthanum hexaboride (LaB6) is used, for example. Crystal orientations in the electron emission surface 11 of the crystal 10 are the same. For example, it is preferable to have a crystal orientation of (100) or (310).

As shown in FIG. 3, the crystal 10 is configured by an upper part 70 and a lower part 80. The upper part 70 and the lower part 80 are integrated. The upper part 70 is columnar, truncated conical, or their combined shape. The columnar shape indicates, for example, a cylinder, a quadrangular prism, or a polygonal prism whose number of corners is greater than four. In the examples of FIGS. 1 to 3, the upper part 70 is formed in the cylindrical shape whose diameter is $\varphi_1$. The top surface of the upper part 70 serves as the electron emission surface 11 (first surface). Desirably, the electron emission surface 11 is circle.

The lower part 80 is columnar or truncated conical. The columnar shape indicates, for example, a cylinder, a quadrangular prism, or a polygonal prism whose number of corners is greater than four. Alternatively, it may be a triangular prism. Alternatively, it may be a combined shape of a plurality of columns or truncated cones whose maximum diameter sizes are different from each other. In the examples of FIGS. 1 to 3, the lower part 80 is formed in the cylindrical shape whose diameter q: is larger than the maximum diameter size of the upper part 70. The lower part 80 has a bearing surface 81 (second surface) whose diameter size is larger than the maximum diameter size of the upper part 70. The bearing surface 81 is the top surface of the lower part 80. The bearing surface 81 is substantially parallel to the electron emission surface 11.

The holding part 12 holds the crystal 10 such that the electron emission surface 11 of the crystal 10 is exposed and at least a portion of the other surfaces of the crystal 10 is covered. As a material of the holding part 12, one of graphite, tantalum, tungsten, and iridium can be used. Specifically, the holding part 12 is formed in the tubular shape having several different inner diameters of a small diameter size (first diameter size) at the upper side and a large diameter size (second diameter size) larger than the small diameter size, the electron emission surface 11 of the crystal 10 is projecting (protruding) from the upper surface, and the crystal 10 is held, in the tube, in a state contacting the bearing surface 81 of the crystal 10. In the holding part 12, an opening part 42 is formed penetrating the center part of the cylinder whose diameter is $\varphi_3$, for example. Concretely, the opening part 42 is formed as described below.

Inside the holding part 12, the opening part 42 is formed in the manner as follows: From the upper surface to the midway height position having a height distance h from the upper surface, the diameter size (first diameter size) of the opening part 42 is ("the maximum diameter size of the upper part 70 of the crystal 10"+α), or increases in a reverse-tapered manner to become, at the midway height position of the height distance h, the maximum diameter size of the upper part 70 of the crystal 10. To the back side from the midway height position having the height distance h, the diameter size (second diameter size) of the opening part 42 is ("the maximum diameter size of the lower part 80, being larger than that of the upper part 70, of the crystal 10"+α). FIG. 3 shows the case where, from the upper surface to the midway height position having the height distance h from the upper surface, an opening part 42-1 is formed to have a diameter size pita, and to the back side from the midway height position having the height distance h, an opening part 42-2 is formed to have a diameter size $\varphi_2+\alpha$. Here, α is a margin for a predetermined mutual insertion (fitting) relationship. Therefore, a counterbore surface 43 (cylinder bottom when viewed from the back side) is formed at the midway height position having the height distance h from the upper surface.

The retaining part 13 is arranged to contact the backside surface of the lower part 80 of the crystal 10. The retaining part 13 retains the crystal 10 not to be separated from the holding part 12. Preferably, the retaining part 13 is formed by the material being the same as that of the holding part 12. As a material of the retaining part 13, one of graphite, tantalum, tungsten, and iridium can be used.

Figure 4:
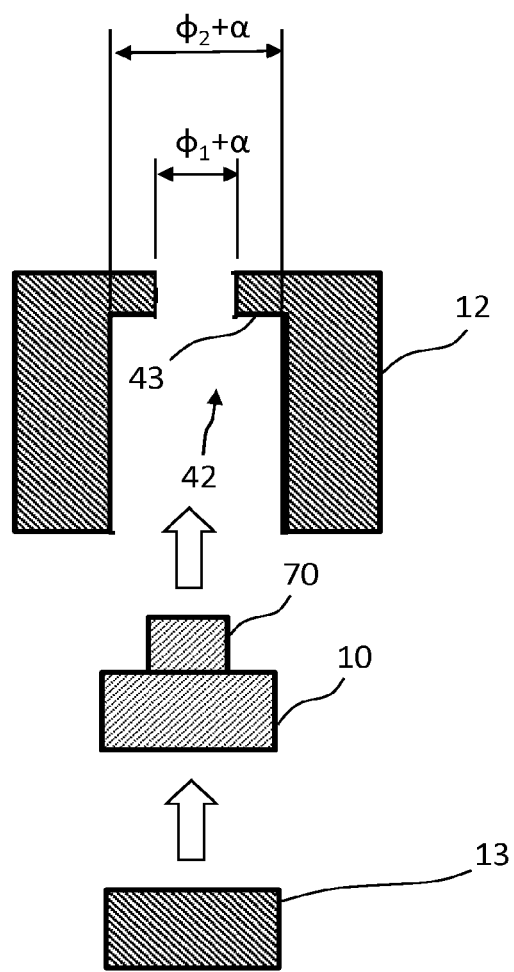
FIG. 4 is a sectional view illustrating an example of a manufacturing method of a cathode mechanism of an electron emission source according to the first embodiment.

FIG. 4 is a sectional view illustrating an example of a manufacturing method of a cathode mechanism of an electron emission source according to the first embodiment. As shown in FIG. 4, first, the crystal 10 is inserted into the opening part 42 from the back side of the holding part 12. The insertion direction of the crystal 10 is such that the upper part 70 is inserted first. The insertion is performed such that the bearing surface 81 contacts the counterbore surface 43 in the opening part 42. By this, the electron emission surface 11 can be projected from the tip of the opening part 42 by a predetermined projection amount (protrusion amount) d. If the bearing surface 81 and the counterbore surface 43 are not in contact with each other, it is difficult to adjust the projection amount d. According to the first embodiment, the crystal 10 can be arranged in accordance with the design size by making the bearing surface 81 contact the counterbore surface 43.

As described above, the retaining part 13 retains the crystal 10, at the back side of the lower part 80 of the crystal 10, not to be separated from the holding part 12 in the state where the electron emission surface 11 is projecting from the tip of the opening part 42, and the bearing surface 81 of the crystal 10 contacts the counterbore surface 43 at which the maximum diameter size (the second diameter size) of the lower part 80 of the crystal 10 in the opening part 42 is changed to the maximum diameter size (the first diameter size) of the upper part 70 of the crystal 10.

Figure 5:
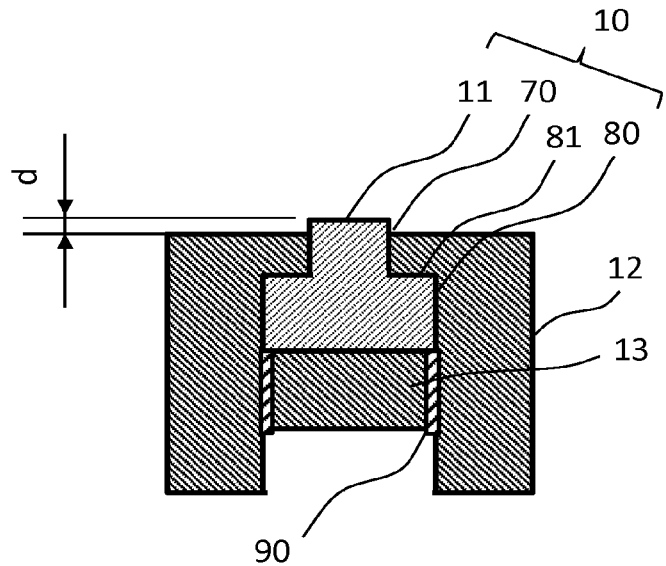
FIG. 5 is an illustration of an example of a fixing method of a retaining part according to the first embodiment.

FIG. 5 is an illustration of an example of a fixing method of a retaining part according to the first embodiment. In the case of FIG. 5, the retaining part 13 whose side surface is coated with an adhesive material 90, such as a carbon paste material, is inserted into the opening part 42 of the holding part 12. By this, the retaining part 13 can be adhesive to the holding part 12. Alternatively, a screw can be substituted for the adhesive material 90, thereby retaining the crystal in the structure and method described above.

Figure 6:
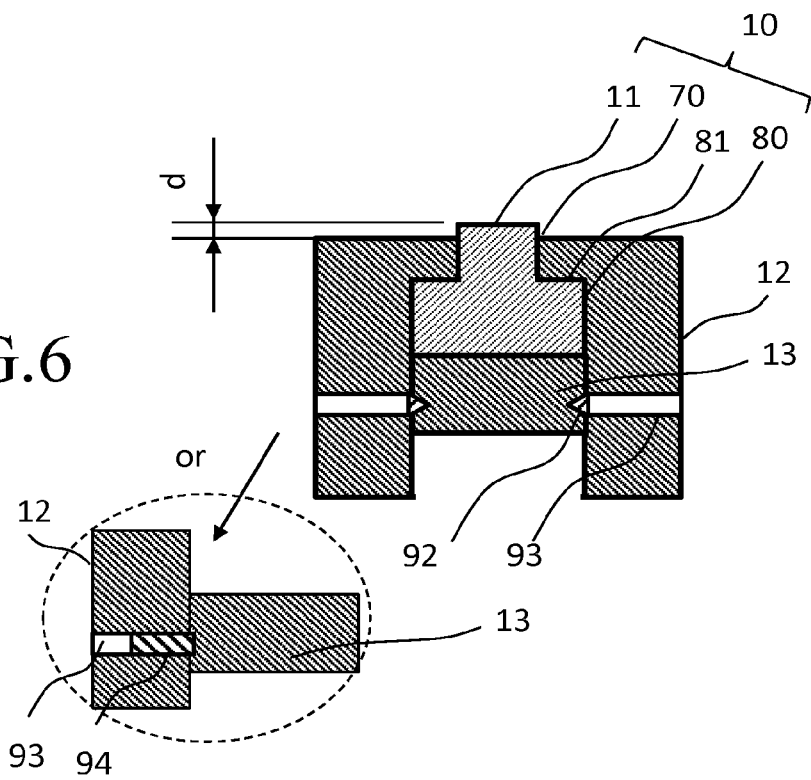
FIG. 6 is an illustration of another example of the fixing method of the retaining part according to the first embodiment.

FIG. 6 is an illustration of another example of the fixing method of the retaining part according to the first embodiment. In the case of FIG. 6, at least one hole 93 penetrating from the outer side of the holding part 12 to the opening part 42 is formed. Each hole 93 is formed at the height position where the retaining part 13 is arranged. For example, the hole 93 is formed horizontally. Further, it is preferable to form two holes 93 by shifting the phase by 180 degrees, for example. Alternatively, it is more preferable to form three holes 93 by shifting the phase by 120 degrees. In the state where the retaining part 13 has been arranged in the opening part 42 of the holding part 12, a wedge 92 is driven into the retaining part 13 through the hole 93. By this, the retaining part 13 is transformed to be fixed in the holding part 12.

Alternatively, at the height position where the retaining part 13 is arranged, a female screw is formed in the side surface of the retaining part 13, at the position corresponding to the hole 93 and in the extending direction of the hole 93. Then, in the state where the retaining part 13 has been arranged in the opening part 42 of the holding part 12, a male screw 94 is inserted through the hole 93, and screwed into the female screw formed in the side surface of the retaining part 13, thereby fixing the retaining part 13 in the holding part 12. Although the male screw 94 having no head is shown in FIG. 6, it is not limited thereto. A bolt being a general screw with a head may also be used.

Alternatively, a female screw is formed in the hole 93 in the holding part 12. Then, in the state where the retaining part 13 has been arranged in the opening part 42 of the holding part 12, it is also preferable to screw the male screw 94 into the hole 93 so as to make the tip of the male screw 94 contact the retaining part 13, and to further press and apply a pressure. Thereby, at the side surface of retaining part 13, the retaining part 13 is fixed in the holding part 12 by friction with the tip of the male screw 94.

As described above, by the structure where the bearing surface 81 contact the counterbore surface 43, the projection amount d of the electron emission surface 11 can be controlled with a high accuracy.

A supporting post 14 (first supporting post) and a supporting post 16 (second supporting post), being a pair, support the holding part 12. Each of the pair of supporting posts 14 and 16 extends with keeping the same section size. They are arranged facing each other to form a space width W therebetween which is larger than the aperture diameter size of the opening part 42. The pair of supporting posts 14 and 16 function as a heater for heating the crystal 10 through the holding part 12.

A pair of base parts 18 and 19 fix the pair of supporting posts 14 and 16. Specifically, the base part 18 fixes the bottom end of the supporting post 14, and the base part 19 fixes the bottom end of the supporting post 16. The base part 18 is connected to a metal wiring 50 supported by an insulator 54, and is supported by the wiring 50. The base part 19 is connected to a metal wiring 52 supported by the insulator 54, and is supported by the wiring 52.

The holding part 12, the pair of supporting posts 14 and 16, and the pair of base parts 18 and 19 are formed in the integrated structure by the same material. As the material of the integrated structure, one of graphite, tantalum, tungsten, and iridium can be used. When integratedly forming the holding part 12, the pair of supporting posts 14 and 16, and the pair of base parts 18 and 19, first, the base material is formed in the shape of a cylinder standing upright at the center of the tabular base part. It is preferable that the width L of the base part is sufficiently longer than the diameter $\varphi_4$ of the cylinder. For example, it is formed to be more than twice the size of the diameter $\varphi_4$. In the case of FIG. 2, it is formed to be the size of about three times, for example. Then, W width notching is performed at the position which is the longitudinal direction center part of the base part and which passes through the center part of the cylinder, while leaving the portion corresponding to the holding part 12, and therefore, the base parts 18 and 19 are separated, and the supporting posts 14 and 16 are also separated. By this, a series current flowing in order through the base part 18, the supporting post 14, the holding part 12, the supporting post 16, and the base part 19 can be formed. The opening part 42 described above is formed in the center part of the upper surface of the cylindrical holding part 12. Thereby, the holding part 12, the pair of supporting posts 14 and 16, and the pair of base parts 18 and 19 can be formed in the integrated structure.

Since the current flowing in the base part 18 of the width L through the electric wire 50 has a large section area, the resistance can be suppressed to be low, and therefore, the calorific value can be suppressed. Then, at the supporting post 14 whose section area is sharply smaller than that of the base part 18, since the resistance is high, the calorific value can be increased. Here, for example, if the shape has a section area which gradually becomes small, since the low resistance portion is small, a high electric power is needed for obtaining a necessary calorific value. In contrast to this, according to the first embodiment, since the supporting post 14 extends toward the holding part 12 while keeping the small section area, the high resistance state can be maintained. Therefore, it is possible to efficiently obtain a necessary calorific value by using a low electric power. The same applies to the supporting post 16.

As described above, the pair of supporting posts 14 and 16 is carved out from the cylindrical portion of the diameter $\varphi_4$. The cylindrical portion of the diameter $\varphi_4$ is carved out into two half-split portions by forming a cut of the width W in the center part while leaving the region of the holding part 12. Furthermore, as shown in the top view of a pair of supporting posts at the upper right of FIG. 1, each of the pair of supporting posts 14 and 16 is formed to be a shape whose outside of the section is an arc and whose width is D by carving out each of the both sides 2 and 4, and 3 and 5 of the half-split portions. Thereby, each of the supporting posts 14 and 16 has the section of three straight line sides and one curved line side. By further carving out each of the both sides 2 and 4, and 3 and 5 of the half-split portions, the section areas of the supporting posts 14 and 16 can be reduced. By reducing the section area, the resistance is increased, and therefore, the temperature can be efficiently increased when flowing (sending) the current.

FIGS. 7A and 7B are illustrations for explaining the life of a cathode according to a comparative example of the first embodiment. FIG. 8 is an illustration for explaining the life of a cathode according to the first embodiment. FIG. 7A shows the case of using a crystal 60 whose lower part is cylindrical and upper part is truncated conical. In the comparative example, the upper surface of a holding part 62 and the upper surface (electron emission surface) of the crystal 60 are arranged to be flush with each other. On the side of the holding part 62, a filler material 61 is arranged, along the slant surface of the truncated conical part of the crystal 60, to have a space against the slant surface. In the comparative example, since the crystal 60 is worn out with use, the electron emission surface retreats as shown in FIG. 7B. When a retreat amount A becomes a predetermined value, a desired brightness distribution is no longer acquired and the life of the cathode reaches the end. When the cathode life reaches the end, it becomes necessary to stop the apparatus each time. If the period from the using start time to the time when the retreat amount A retreating from the upper surface of the holding part 62 reaches a predetermined value is short, the frequency of changing the cathode increases, and therefore, the apparatus down-time increases. By contrast, according to the first embodiment, as shown in FIG. 8, the electron emission surface 11 is arranged such that it is projected from the upper surface of the holding part 12 by a predetermined projection amount d. Therefore, the period from the using start time to the time when the retreat amount A retreating from the upper surface of the holding part 12 reaches a predetermined value can be longer than that of the comparative example. Thus, the life of the cathode can be extended. However, for acquiring a stable brightness of the beam or a uniform brightness distribution, it is not just a matter of making the electron emission surface 11 projected from the upper surface of the holding part 12. Controlling the projection amount d is important.

Figure 9:
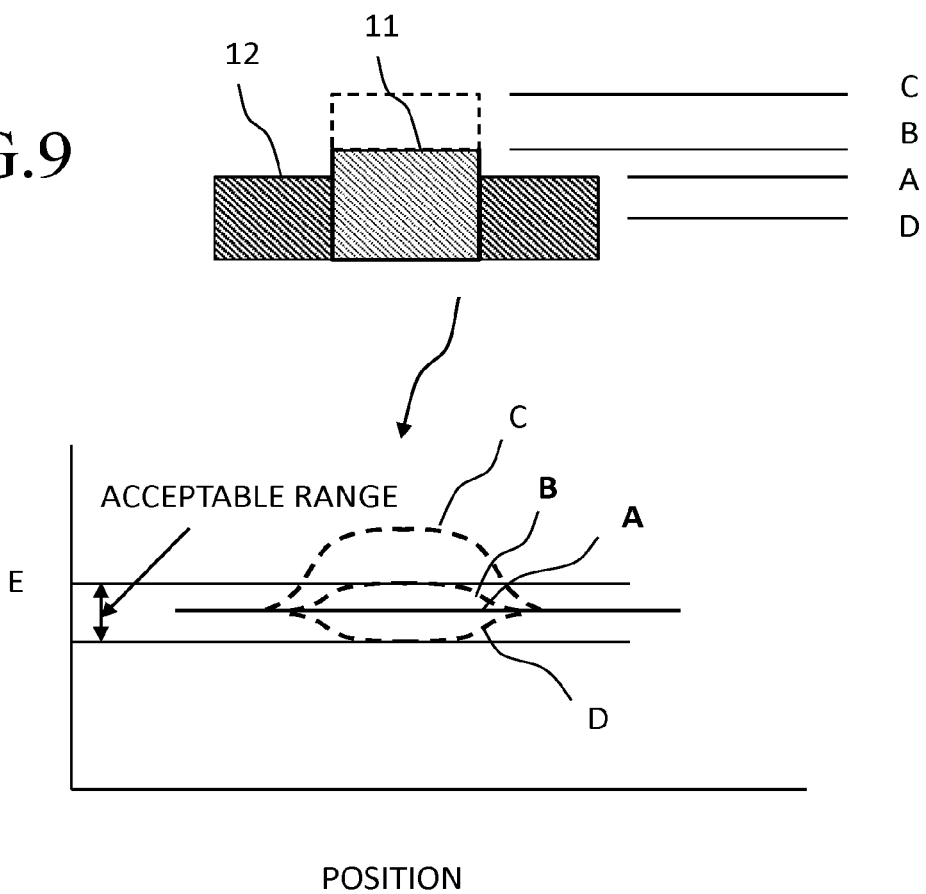
FIG. 9 is an illustration explaining a relation between the height position of an electron emission surface of a crystal and an electric field distribution according to the first embodiment.

FIG. 9 is an illustration explaining a relation between the height position of an electron emission surface of a crystal and an electric field distribution according to the first embodiment. FIG. 9 shows the case where the electron emission surface 11 is at the height position A which is flush with the upper surface of the holding part 12, at the height position B which is projecting from the upper surface of the holding part 12, at the height position C which is further projecting than the height position B, and at the height position D which retreats from the upper surface of the holding part 12. The graph of FIG. 9 shows an electric field distribution close to the electron emission surface 11 in each of the states A to D. If the height position of the electron emission surface 11 shifts from the upper surface of the holding part 12, the electric field distribution close to the electron emission surface 11 becomes non-uniform. If the height position of the electron emission surface 11 largely shifts from the upper surface of the holding part 12, along with this, the electric field distribution deviates largely. If the deviation of the electric field distribution becomes large, the lens effect by the electric field becomes large, and therefore, the beam becomes spreading and it becomes difficult to control the brightness (or current density) or the brightness distribution (or current density distribution) on the target object surface to be within an acceptable range. Accordingly, the height position of the electron emission surface 11 needs to be adjusted within the acceptable range.

Figure 10A:
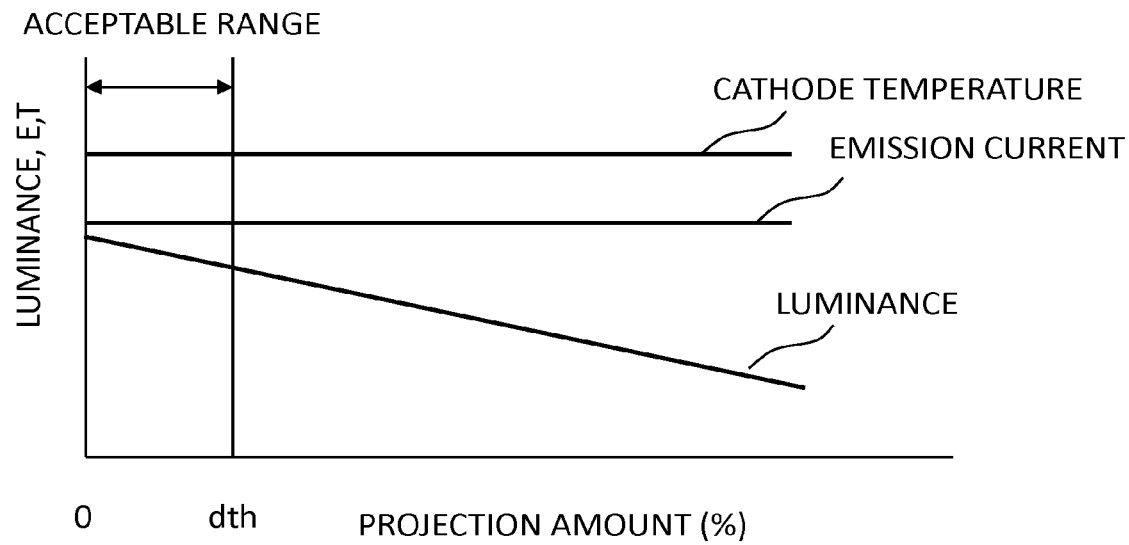
FIG. 10A is a graph showing a relation of a brightness, a cathode temperature and an emission current with respect to a projection amount of an electron emission surface according to the first embodiment.

FIG. 10A is a graph showing a relation of a brightness, a cathode temperature and an emission current with respect to a projection amount of an electron emission surface according to the first embodiment. In FIG. 10A, the projection amount of the electron emission surface is shown by the rate of the projection amount to the diameter of the electron emission surface 11. Under certain conditions of the cathode temperature and the emission current, the brightness decreases along with an increase in the projection amount. The more electrons are emitted from the restricted electron emission surface 11, the higher the brightness becomes. In the structure where the electron emission surface 11 is projected (protruded), electrons are emitted not only from the electron emission surface 11 but also from the cylindrical outer periphery. Thus, in the projecting structure, it is necessary to take the area of the outer peripheral surface into consideration in addition to the electron emission surface 11. In comparison, under certain conditions of the emission current and the same condition of the cathode temperature, since the surface area of the crystal 10 in the projecting structure is larger than that of the crystal in the nonprojecting structure, the electron density obtained by dividing the emission current by the surface area is low in the projecting structure. Consequently, the brightness is low. For maintaining the brightness to be uniform, the cathode temperature and the emission current need to be increased. However, there is a limit in increasing the cathode temperature and the emission current. Therefore, for maintaining a desired brightness range (acceptable range) for the whole of the beams, there is a restriction to the projection amount d of the electron emission surface.

Figure 10B:
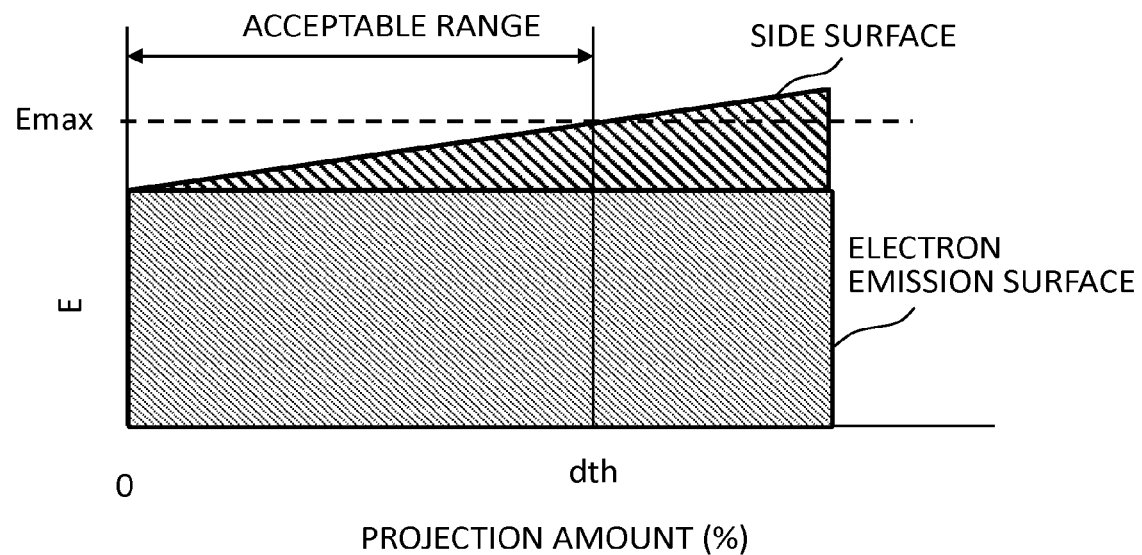
FIG. 10B is a graph showing a relation between an emission current and a projection amount of an electron emission surface according to the first embodiment.

FIG. 10B is a graph showing a relation between an emission current and a projection amount of an electron emission surface according to the first embodiment. In FIG. 10B, the ordinate axis indicates an emission current E, and the abscissa axis indicates a projection amount (%) of an electron emission surface. In FIGS. 10A and 10B, the reduction scales are not the same as each other. FIG. 10B shows a change of the emission current in the case of maintaining a current density J, instead of the brightness, to be constant. Since the brightness (current density) decreases when the projection amount of the electron emission surface is increased as shown in FIG. 10A, in order to maintain a constant brightness (current density), the emission current E is increased as shown in FIG. 10B. In addition, the cathode temperature is also increased. It is not preferable to increase the emission current because increasing the emission current links to increasing the capacity of the power source which controls the emission current. Further, increasing the cathode temperature accelerates evaporation and sublimation of the crystal, and therefore, the life is shortened. Even when the cathode temperature increase is permitted, the maximum Emax of the emission current E is determined (obtained) based on the guarantee range of the high voltage power supply. Consequently, as shown in FIG. 10B, the projection amount of the electron emission surface, which serves as the maximum Emax of the emission current E, is uniquely determined that the projection amount is 10% of the diameter of the electron emission surface. Therefore, it is preferable that the projection amount d of the electron emission surface 11 projecting from the upper surface of the holding part 12 is 10% or less than the diameter of the electron emission surface 11.

According to the first embodiment, it is possible to prevent the electron emission surface 11 from projecting more than needed by making the bearing surface 81 of the crystal 10 and the counterbore surface 43 of the holding part 12 contact each other. Therefore, if the distance between the electron emission surface 11 and the bearing surface 81 and the distance between the upper surface of the holding part 12 and the counterbore surface 43 are manufactured with sufficient accuracy, the structure in which the projection amount d of the electron emission surface 11 is controlled highly accurately can be obtained, in manufacturing the cathode mechanism 222, by making the bearing surface 81 and the counterbore surface 43 contact each other.

Although the examples of FIGS. 1 and 3 show the case where the shape of the upper part 70 of the crystal 10 is columnar (cylindrical), it is not limited thereto.

Figure 11:
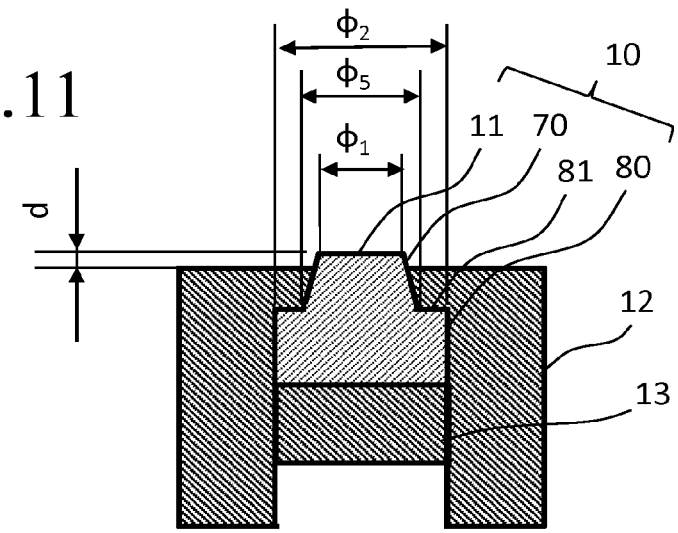
FIG. 11 is an expanded sectional view of another example of a crystal, a holding part, and a retaining part according to the first embodiment.

FIG. 11 is an expanded sectional view of another example of a crystal, a holding part, and a retaining part according to the first embodiment. In the case of FIG. 11, the shape of the upper part 70 of the crystal 10 is truncated conical. In FIG. 11, the truncated cone expands in a reverse-tapered manner from the electron emission surface 11 of the diameter $\varphi_1$ toward the lower end of the diameter $\varphi_5$ in the upper part 70. In that case, the maximum diameter size of the upper part 70 is the diameter $\varphi_5$ of the lower end in the upper part 70. The lower part 80 is formed in the cylindrical shape of the diameter $\varphi_2$ which is larger than the diameter $\varphi_5$ being the maximum diameter size of the upper part 70. Therefore, the bearing surface 81 is a flat surface between the diameters $\varphi_5$ and $\varphi_2$.

Inside the holding part 12, the opening part 42 is formed in the manner as follows: From the upper surface to the midway height position having a height distance h from the upper surface, the diameter size of the opening part 42 increases in a reverse-tapered manner to become, at the midway height position of the height distance h, the maximum diameter size of the upper part 70 of the crystal 10. To the back side from the midway height position having the height distance h, the diameter size of the opening part 42 is the maximum diameter size (second diameter size) of the lower part 80 of the crystal 10 which is larger than the maximum diameter size of the upper part 70 of the crystal 10. FIG. 11 shows the case where the opening part 42 is formed, from the upper surface to the midway height position having the height distance h from the upper surface, to expand in a reverse-tapered manner along the slant surface of the upper part 70 and to have a diameter size $\varphi_5+\alpha$ at the midway height position having the height distance h, and to the back side from the midway height position having the height distance h, to have a diameter size $\varphi_2+\alpha$. Here, $\alpha$ is a margin for a predetermined mutual insertion (fitting) relationship. Therefore, the counterbore surface 43 is formed at the midway height position having the height distance h from the upper surface.

Figure 12:
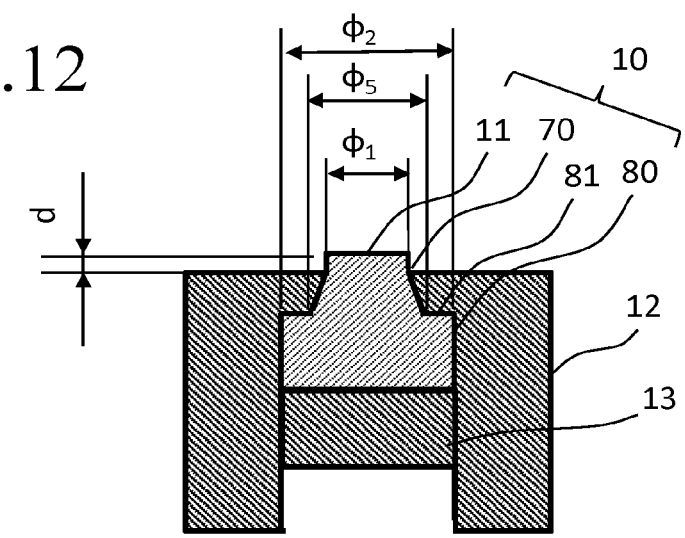
FIG. 12 is an expanded sectional view of another example of a crystal, a holding part, and a retaining part according to the first embodiment.

FIG. 12 is an expanded sectional view of another example of a crystal, a holding part, and a retaining part according to the first embodiment. In the case of FIG. 12, the shape of the upper part 70 of the crystal 10 is a combined shape of a cylinder and a truncated cone. FIG. 12 shows the case where the cylinder is arranged on the truncated cone. In FIG. 12, with respect to the upper part 70 of the crystal 10, the shape from the portion close to the upper surface of the holding part 12 to the electron emission surface 11 is cylindrical, and the shape from the portion close to the upper surface of the holding part 12 to the lower part 80 of the crystal 10 is truncated conical. In FIG. 12, the electron emission surface 11 has a diameter $\varphi_1$, and the same diameter $\varphi_1$ is maintained to the upper surface of the holding part 12. Then, the truncated cone is formed such that it expands in a reverse-tapered manner from the height position of the upper surface of the holding part 12 where the diameter is $\varphi_1$, to the lower end of the upper part 70 where the diameter is $\varphi_5$. In that case, the maximum diameter size of the upper part 70 is the diameter $\varphi_5$ of the lower end of the upper part 70. The lower part 80 is formed in a cylindrical shape of the diameter $\varphi_2$ which is larger than the diameter $\varphi_5$ being the maximum diameter size of the upper part 70. Therefore, the bearing surface 81 is a flat surface between the diameters $\varphi_5$ and $\varphi_2$.

Inside the holding part 12, the opening part 42 is formed in the manner as follows: From the upper surface to the midway height position having the height distance h from the upper surface, the diameter size of the opening part 42 increases in a reverse-tapered manner to become, at the midway height position of the height distance h, the maximum diameter size of the upper part 70 of the crystal 10. To the back side from the midway height position having the height distance h, the diameter size of the opening part 42 is the maximum diameter size (second diameter size) of the lower part 80 of the crystal 10 which is larger than the maximum diameter size of the upper part 70 of the crystal 10. In FIG. 12, the opening part 42 is formed such that it has a diameter $\varphi_1+\alpha$ at the upper surface, and, from the upper surface to the midway height position having the height distance h from the upper surface, it expands in a reverse-tapered manner along the slant surface of the upper part 70 to have a diameter size (5+a at the midway height position having the height distance h. Then, to the back side from the midway height position having the height distance h, it has a diameter size $\varphi_2+\alpha$. Here, $\alpha$ is a margin for a predetermined mutual insertion (fitting) relationship. Therefore, the counterbore surface 43 is formed at the midway height position having the height distance h from the upper surface.

Although, in the examples described above, there is no space substantially between the side surface of the opening part 42 inside the holding part 12 and the side surface of the upper part 70 of the crystal 10, it is not limited thereto.

Figure 13:
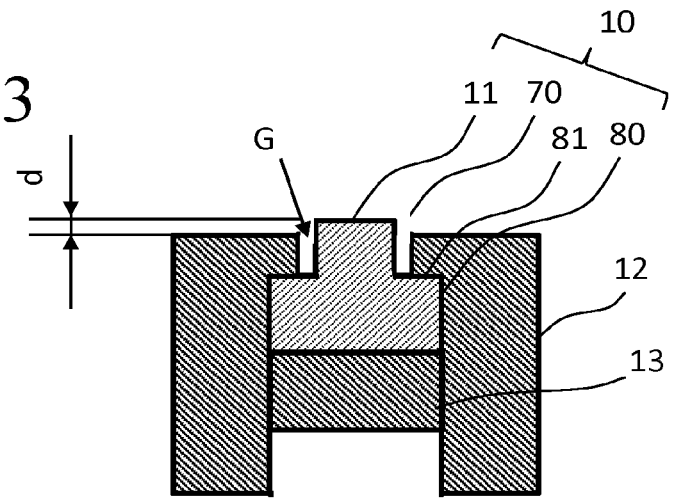
FIG. 13 is an expanded sectional view of another example of a crystal, a holding part, and a retaining part according to the first embodiment.

FIG. 13 is an expanded sectional view of another example of a crystal, a holding part, and a retaining part according to the first embodiment. FIG. 13 shows a structure where there is a space G between the side surface of the upper part 70 of the crystal 10 and the holding part 12. Other structure of FIG. 13 is the same as that of FIG. 3.

Figure 14:
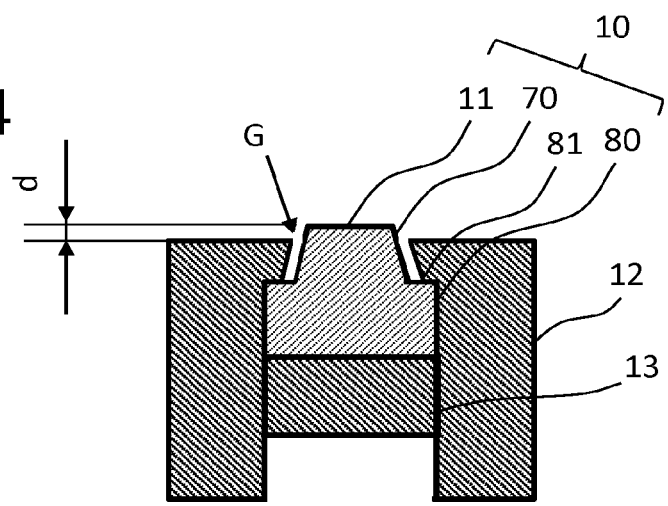
FIG. 14 is an expanded sectional view of another example of a crystal, a holding part, and a retaining part according to the first embodiment.

FIG. 14 is an expanded sectional view of another example of a crystal, a holding part, and a retaining part according to the first embodiment. FIG. 14 shows a structure where there is a space G between the slant surface of the truncated cone being the upper part 70 of the crystal 10 and the holding part 12. Other structure of FIG. 14 is the same as that of FIG. 11.

Figure 15:
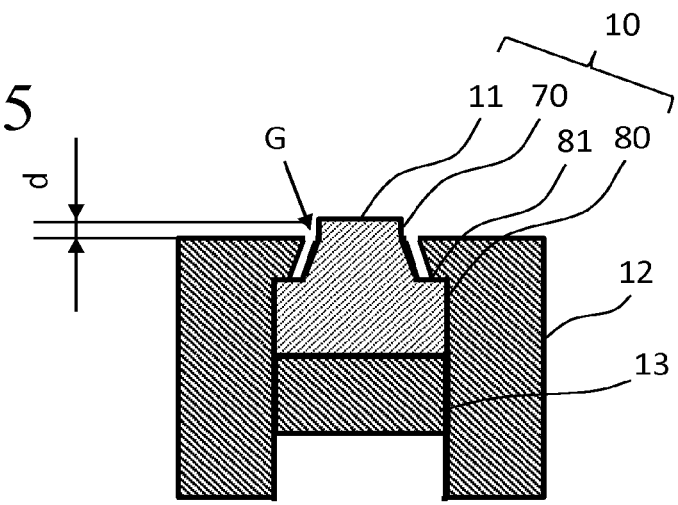
FIG. 15 is an expanded sectional view of another example of a crystal, a holding part, and a retaining part according to the first embodiment.

FIG. 15 is an expanded sectional view of another example of a crystal, a holding part, and a retaining part according to the first embodiment. FIG. 15 shows a structure where there is a space G between the slant surface of the truncated cone being the upper part 70 of the crystal 10 and the holding part 12. Other structure of FIG. 15 is the same as that of FIG. 12.

Any structure shown in FIGS. 3 and 11 to 15 may be used. It is possible to extend the life of the cathode while highly accurately controlling the projection amount of the electron emission surface 11 by using any of the structures described above.

Figure 16:
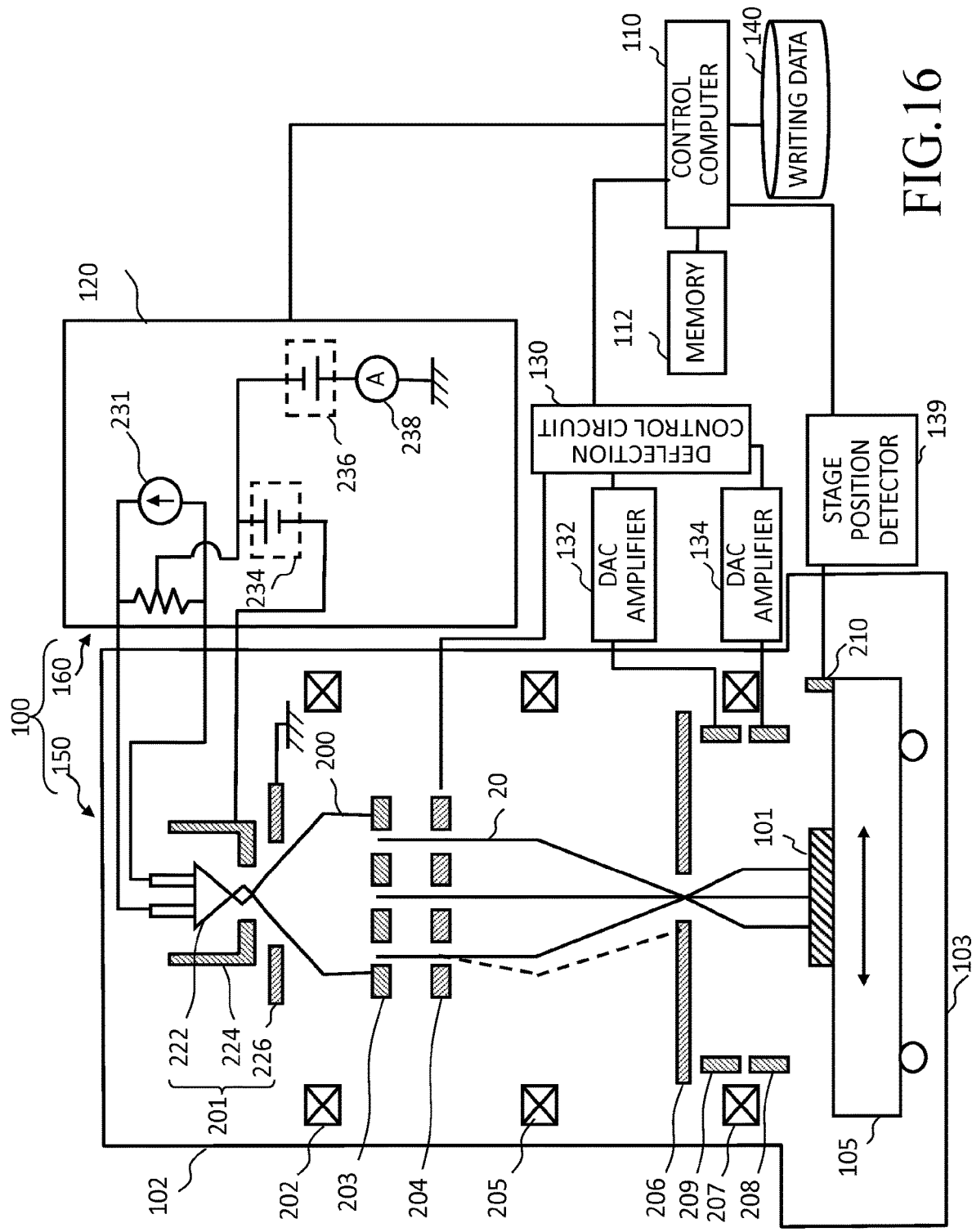
FIG. 16 is a schematic diagram showing a configuration of a writing apparatus according to the first embodiment.

FIG. 16 is a schematic diagram showing a configuration of a writing or "drawing" apparatus according to the first embodiment. As shown in FIG. 16, a writing apparatus 100 includes a writing mechanism 150 and a control system circuit 160. The writing apparatus 100 is an example of a multiple electron beam writing apparatus. The writing mechanism 150 includes an electron beam column 102 (multiple electron beam column) and a writing chamber 103. In the electron beam column 102, there are disposed an electron emission source 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, an XY stage 105 is disposed. On the XY stage 105, there is placed a target object or "sample" 101 such as a mask blank on which resist has been applied serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105 is placed.

The electron emission source 201 (electron beam emission source) includes the above-described cathode mechanism 222. The electron emission source 201 includes a Wehnelt 224 (Wehnelt electrode) and an anode 226 (anode electrode) in addition to the cathode mechanism 222. Further, the anode 226 is controlled to have a potential more positive than that of the crystal 10 of the cathode mechanism 222, and pulls out thermal electrons emitted from the crystal 10. For example, the anode 226 is grounded.

The control system circuit 160 includes a control computer 110, a memory 112, an electron emission source power supply 120, a deflection control circuit 130, DAC (digital-analog converter) amplifier units 132 and 134, a stage position detector 139, and a storage device 140 such as a magnetic disk drive. The control computer 110, the memory 112, the electron emission source power supply 120, the deflection control circuit 130, the DAC amplifier units 132 and 134, the stage position detector 139, and the storage device 140 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and each electrode is controlled by the deflection control circuit 130 through the DAC amplifier 134. The deflector 209 is composed of at least four electrodes (or "poles"), and each electrode is controlled by the deflection control circuit 130 through the corresponding DAC amplifier unit 132. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light.

Information input/output to/from the control computer 110 and information being operated are stored in the memory 112 each time.

In the electron emission source power supply 120, there are arranged an acceleration voltage power circuit 236, a bias voltage power circuit 234, a filament power supply circuit 231 (filament power supply unit), and an ammeter 238.

The negative electrode (−) side of the acceleration voltage power circuit 236 is connected to the electric wires 50 and 52 of both the poles of the cathode mechanism 222 in the electron beam column 102. The positive electrode (+) side of the acceleration voltage power circuit 236 is grounded through the ammeter 238 connected in series. Further, the negative electrode (−) of the acceleration voltage power circuit 236 branches to be also connected to the positive electrode (+) of the bias voltage power circuit 234.

The negative electrode (−) of the bias voltage power circuit 234 is electrically connected to the Wehnelt 224 disposed between the cathode mechanism 222 and the anode 226. In other words, the bias voltage power circuit 234 is arranged to be electrically connected between the negative electrode (−) of the acceleration voltage power circuit 236 and the Wehnelt 224. Then, the filament power supply circuit 231 supplies a current between the electric wires 50 and 52 of both the electrodes of the cathode mechanism 222 in order to heat the crystal 10 in the cathode mechanism 222 to a predetermined temperature. In other words, the filament power supply circuit 231 supplies a filament power to the cathode mechanism 222. The filament power and the cathode temperature T (heating temperature of the crystal 10) can be defined by a certain relation, and the cathode can be heated to a desired temperature by the filament power. Thus, the cathode temperature T is controlled by the filament power. The filament power is defined by the product of a current flowing between both the electrodes of the cathode mechanism 222 and a voltage applied between both the electrodes of the cathode mechanism 222 by the filament power supply circuit 231. The acceleration voltage power circuit 236 applies an acceleration voltage between the cathode mechanism 222 and the anode 226. The bias voltage power circuit 234 applies a negative bias voltage to the Wehnelt 224.

Writing data is input from the outside of the writing apparatus 100, and stored in the storage device 140. The writing data generally defines information on a plurality of figure patterns to be written. Specifically, it defines a figure code, coordinates, size, and the like of each figure pattern.

FIG. 16 shows a configuration necessary for describing the first embodiment. Other configuration elements generally necessary for the writing apparatus 100 may also be included therein.

Figure 17:
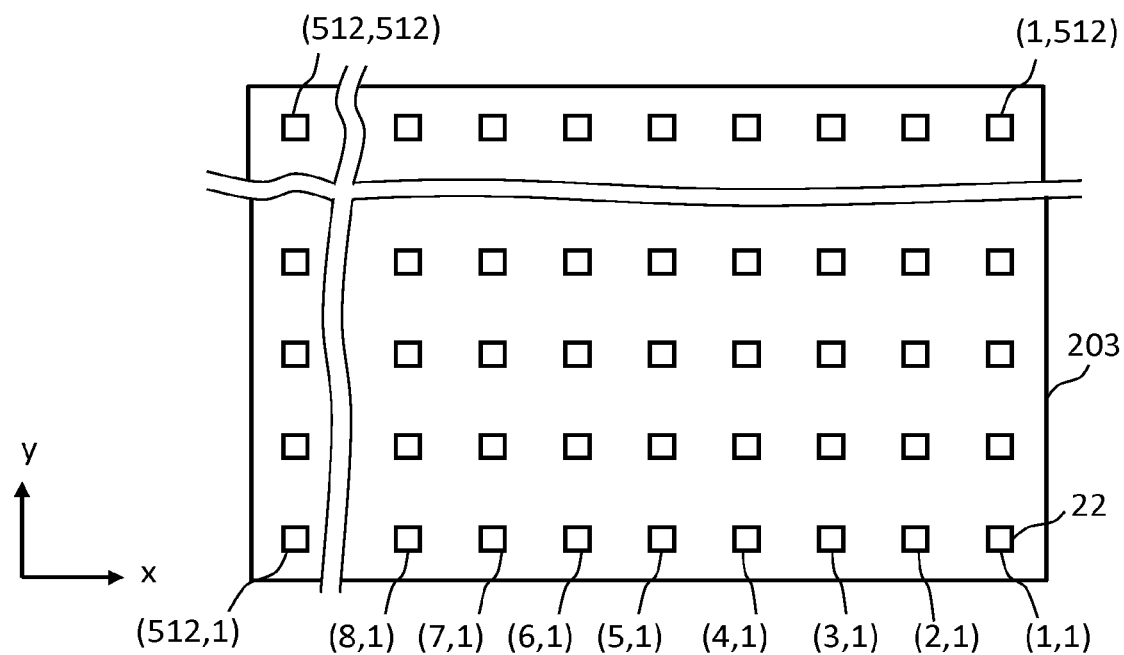
FIG. 17 is a conceptual diagram showing a configuration of a shaping aperture array substrate according to the first embodiment.

FIG. 17 is a conceptual diagram showing a configuration of a shaping aperture array substrate according to the first embodiment. As shown in FIG. 17, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 17, for example, holes 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms multiple beams 20. Specifically, the multiple beams 20 are formed by letting portions of an electron beam 200 individually pass through a corresponding one of a plurality of holes 22. The method of arranging the holes 22 is not limited to the case of FIG. 17 where the holes are arranged like a grid in the width and length directions. For example, with respect to the x-direction kth and (k+1) th rows which are arrayed in the length direction (in the y direction), each hole in the kth row and each hole in the (k+1) th row may be arranged mutually displaced in the width direction (in the x direction) by a dimension "a". Similarly, with respect to the x-direction (k+1) th and (k+2) th rows which are arrayed in the length direction (in the y direction), each hole in the (k+1) th row and each hole in the (k+2) th row may be arranged mutually displaced in the width direction (in the x direction) by a dimension "b".

Figure 18:
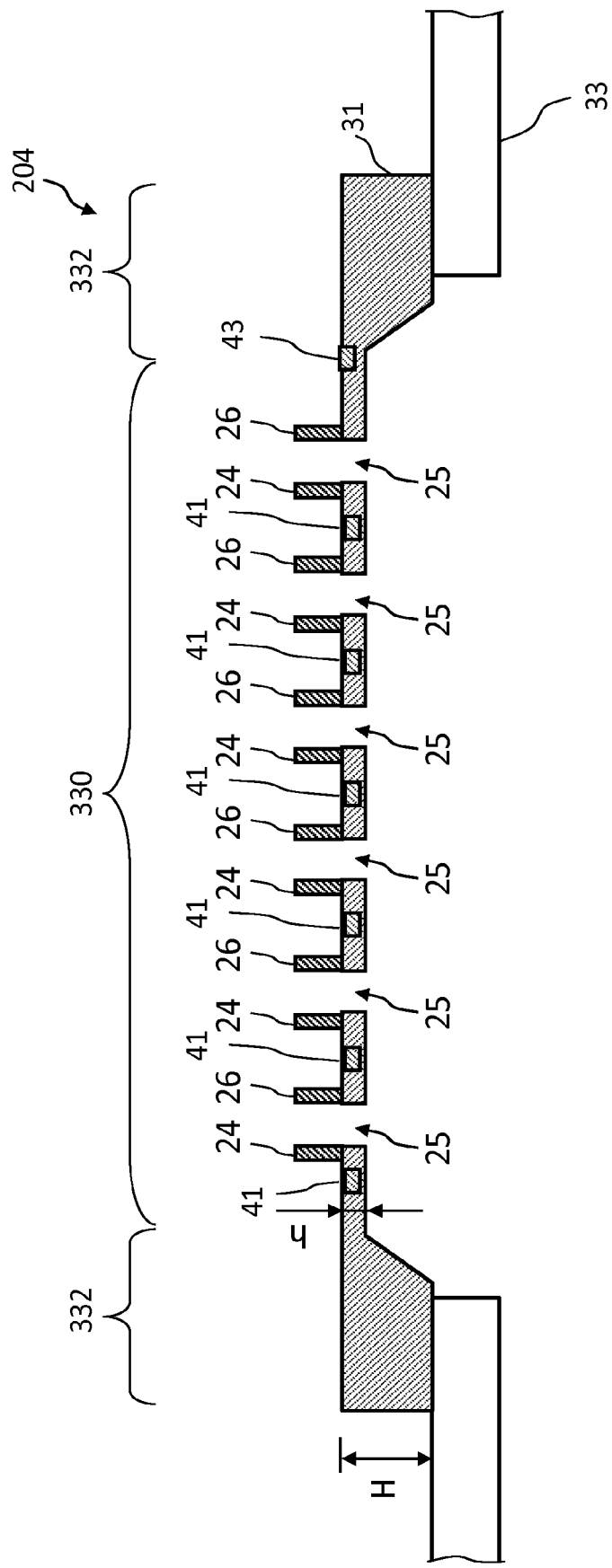
FIG. 18 is a sectional view of a structure of a blanking aperture array mechanism according to the first embodiment.

FIG. 18 is a sectional view of a structure of a blanking aperture array mechanism according to the first embodiment. With regard to the configuration of the blanking aperture array mechanism 204, a semiconductor substrate 31 made of silicon, etc. is placed on a support table 33 as shown in FIG. 18. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 17. In other words, in the membrane region 330 of the substrate 31, there are formed a plurality of passage holes 25, in an array state, through each of which a corresponding one of the multiple electron beams 20 passes. Further, in the membrane region 330 of the substrate 31, there are arranged a plurality of electrode pairs each composed of two electrodes being opposite to each other with respect to a corresponding one of the plurality of passage holes 25. Specifically, in the membrane region 330, as shown in FIG. 18, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Further, close to each passage hole 25 in the membrane region 330, inside the substrate 31, there is arranged a control circuit 41 (logic circuit) which applies a deflection voltage to the control electrode 24 for the passage hole 25 concerned. The counter electrode 26 for each beam is grounded.

In the control circuit 41, there is arranged an amplifier (an example of a switching circuit) (not shown) such as a CMOS inverter circuit. The output line (OUT) of the amplifier is connected to the control electrode 24. In contrast, the counter electrode 26 is applied with a ground electric potential. As an input (IN) of the amplifier, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. By contrast, in a state (active state) where an H potential is applied to the input (IN) of the amplifier, the output (OUT) of the amplifier becomes a ground potential, and therefore, since there is no potential difference from the ground potential of the counter electrode 26, a corresponding beam is not deflected, and controlled to be in a beam ON condition by passing through the limiting aperture substrate 206.

A pair of the control electrode 24 and the counter electrode 26 individually provides blanking deflection of a corresponding beam of the multiple beams 20 by an electric potential switchable by the amplifier which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 of the writing apparatus 100 will be described. The writing mechanism 150 writes a pattern on the target object 101, using thermal electrons emitted from the electron emission source 201. Specifically, it operates as follows. The electron beam 200 emitted from the electron emission source 201 (electron emission source) illuminates the whole of the shaping aperture array substrate 203 by the illumination lens 202. A plurality of rectangular (including square) holes 22 (openings) are formed in the shaping aperture array substrate 203. The region including all of the plurality of holes 22 is irradiated with the electron beam 200. For example, a plurality of rectangular (including square) electron beams (multiple beams 20) are formed by letting portions of the electron beam 200 applied to the positions of the plurality of holes 22 individually pass through a corresponding hole of the plurality of holes 22 in the shaping aperture array substrate 203. The multiple beams 20 individually pass through corresponding blankers (first deflector: individual blanking mechanism) of the blanking aperture array mechanism 204. Each blanker deflects (provides blanking deflection) an electron beam passing therethrough individually.

The multiple beams 20 having passed through the blanking aperture array mechanism 204 are reduced by the reducing lens 205, and go toward the hole formed in the center of the limiting aperture substrate 206. Then, the electron beam in the multiple beams 20 which was deflected by the blanker of the blanking aperture array mechanism 204 deviates (shifts) from the hole in the center of the limiting substrate 206 and is blocked by the limiting aperture substrate 206. By contrast, the electron beam which was not deflected by the blanker of the blanking aperture array mechanism 204 passes through the hole in the center of the limiting aperture substrate 206 as shown in FIG. 16. Blanking control is provided by ON/OFF of the individual blanking mechanism so as to control ON/OFF of beams. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed (all of the multiple beams 20 having passed) through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 in the shaping aperture array substrate 203 by a desired reduction ratio described above.

Figure 19:
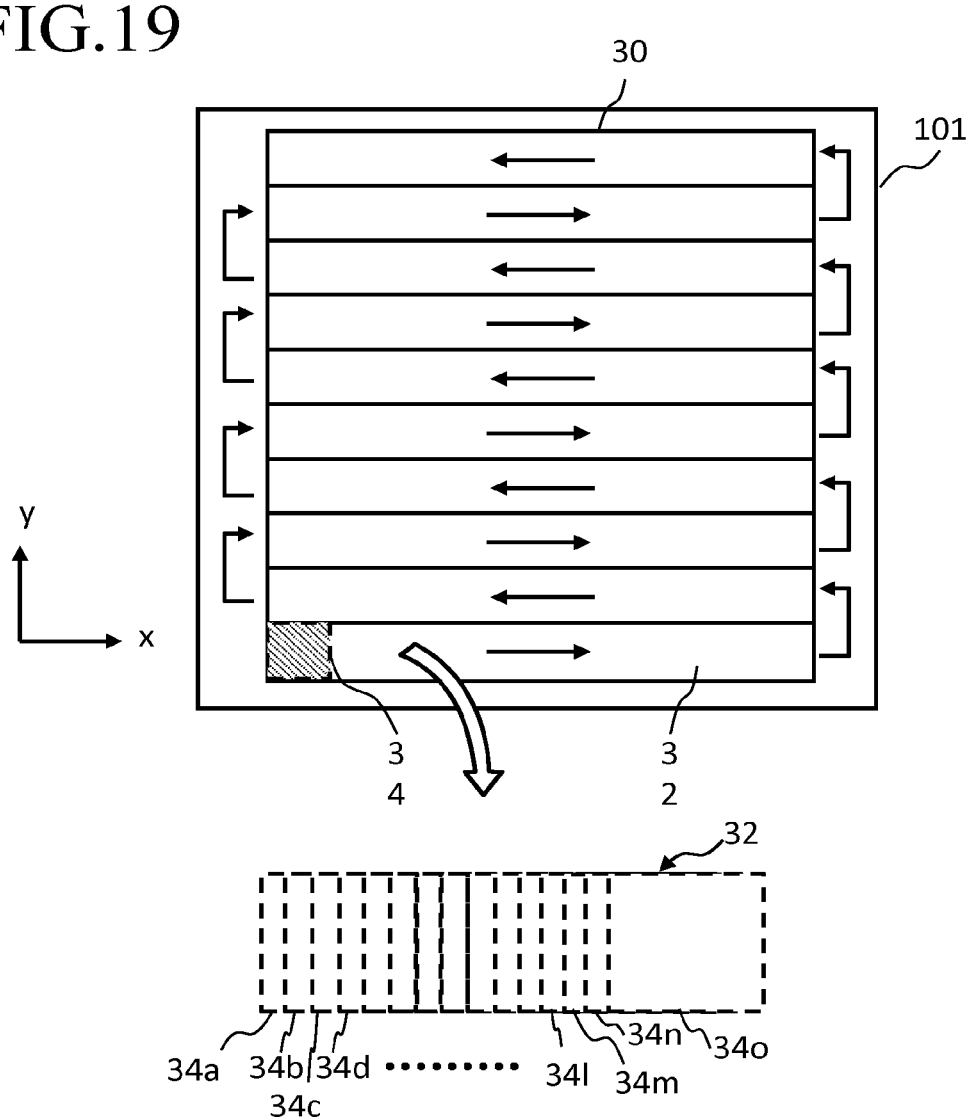
FIG. 19 is a conceptual diagram illustrating an example of a writing operation according to the first embodiment.

FIG. 19 is a conceptual diagram illustrating an example of a writing operation according to the first embodiment. As shown in FIG. 19, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the -x direction, so that the writing may relatively proceed in the x direction. The XY stage 105 is moved, for example, continuously at a constant speed. After writing the first stripe region 32, the stage position is moved in the -y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the -x direction. That is, writing is performed while alternately changing the direction, such as performing writing in the x direction in the third stripe region 32, and in the -x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. Further, although FIG. 19 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 20:
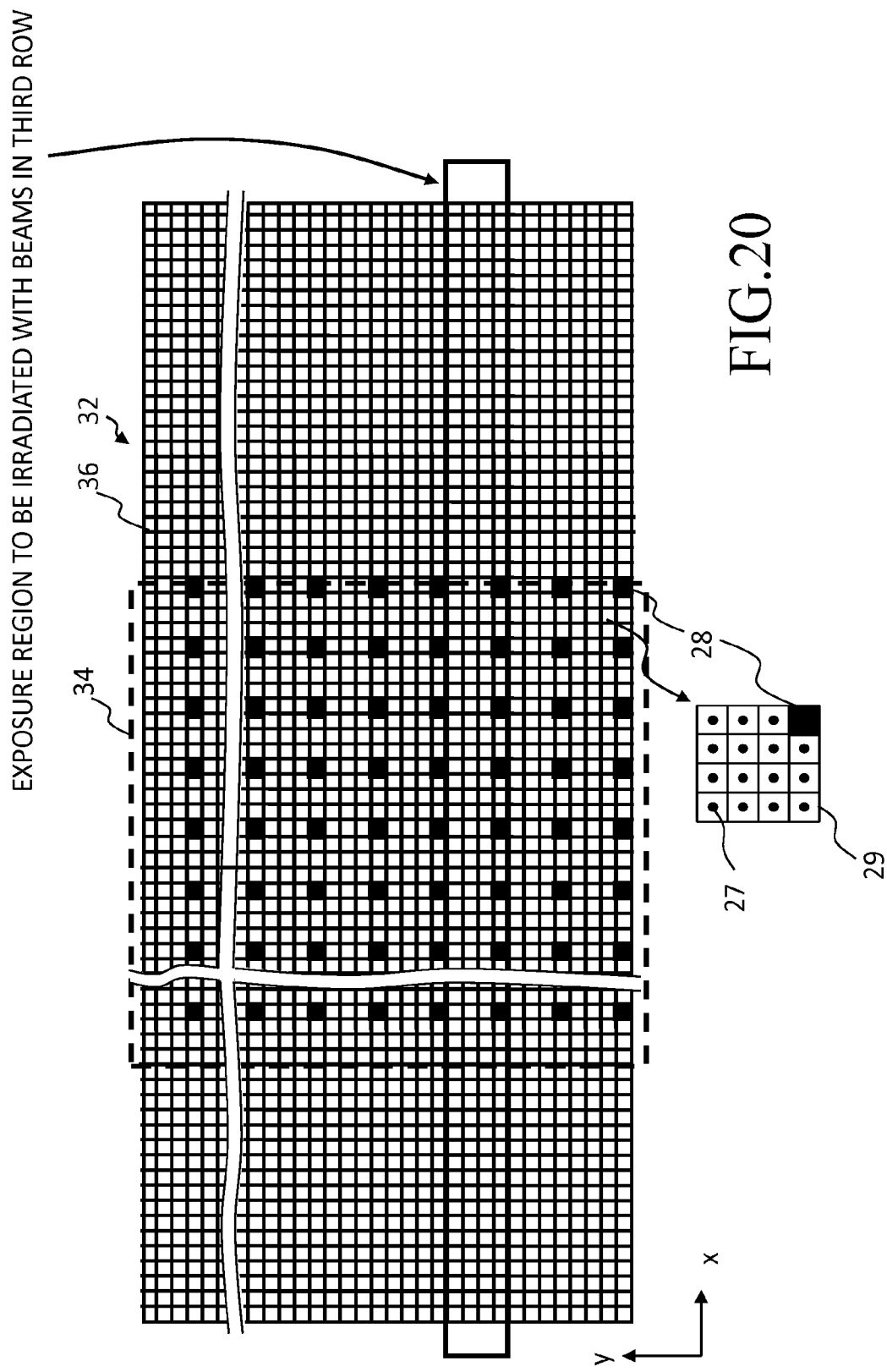
FIG. 20 is a diagram showing an example of an irradiation region of multiple beams and a pixel to be written according to the first embodiment.

FIG. 20 is a diagram showing an example of an irradiation region of multiple beams and a pixel to be written (writing target pixel) according to the first embodiment. In FIG. 20, in the stripe region 32, there are set a plurality of control grids 27 (design grids) arranged in a grid form at the beam size pitch of the multiple beams 20 on the surface of the target object 101, for example. Preferably, they are arranged at a pitch of around 10 nm. The plurality of control grids 27 serve as design irradiation positions of the multiple beams 20. The arrangement pitch of the control grid 27 is not limited to the beam size, and may be any size that can be controlled as a deflection position of the deflector 209 regardless of the beam size. Then, a plurality of pixels 36, each of which is centering on each control grid 27, are set by virtually dividing into a mesh form by the same size as that of the arrangement pitch of the control grid 27. Each pixel 36 serves as an irradiation unit region per beam of the multiple beams. FIG. 20 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 20 shows the case where the multiple beams of 512×512 (rows×columns) are simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 20, one sub-irradiation region 29 is a region surrounded by beam pitches. In the case of FIG. 20, each sub-irradiation region 29 is composed of 4×4 pixels.

Figure 21:
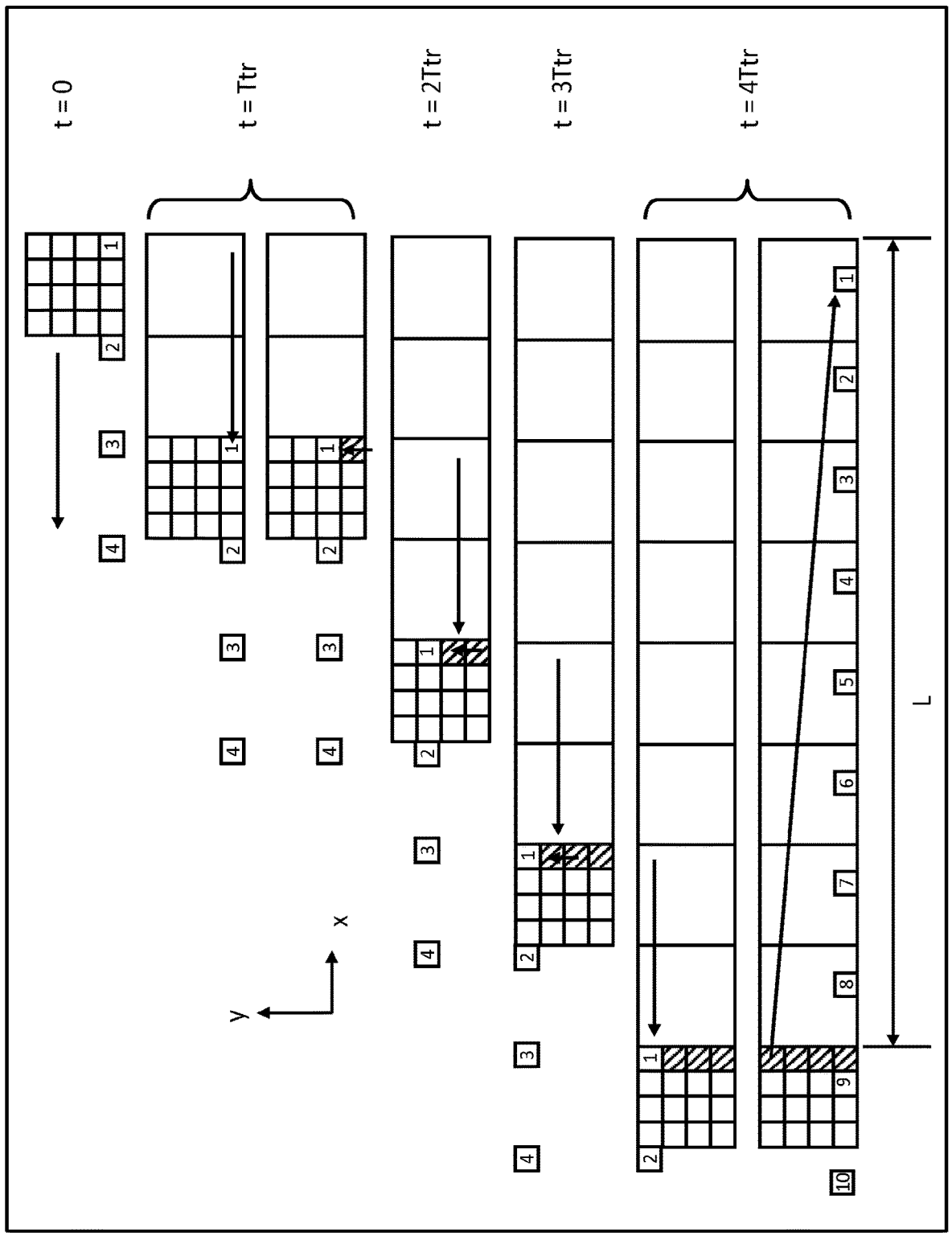
FIG. 21 is a diagram illustrating an example of a writing method of multiple beams according to the first embodiment.

FIG. 21 is a diagram illustrating an example of a writing method of multiple beams according to the first embodiment. FIG. 21 shows a portion of the sub-irradiation region 29 to be written by each of beams at the coordinates (1, 3), (2, 3), (3, 3), . . . , (512, 3) in the y-direction third row from the bottom in the multiple beams for writing the stripe region 32 shown in FIG. 20. In the example of FIG. 21, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 21, one tracking cycle is executed by writing (exposing) four pixels while shifting, per shot, the irradiation target pixel 36 in the y direction during a movement by the distance of eight beam pitches.

Specifically, the writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each beam of the multiple beams of the shot concerned. The maximum irradiation time Ttr is set in advance. Although the time obtained by adding a settling time of beam deflection to the maximum irradiation time Ttr actually serves as a shot cycle, the settling time of beam deflection is omitted here to indicate the maximum irradiation time Ttr as the shot cycle. After one tracking cycle is completed, the tracking control is reset so as to swing back (return) the tracking position to the starting position of a next tracking cycle.

Since writing of the pixels in the first column from the right of each sub-irradiation region 29 has been completed, in the next tracking cycle after resetting the tracking, first, the deflector 209 performs deflection such that the writing position of each corresponding beam is adjusted (shifted) to the control grid 27 of the pixel at the bottom row in the second column from the right of each sub-irradiation region 29.

As described above, in the state where the relative position of the irradiation region 34 to the target object 101 is controlled by the deflector 208 to be the same (unchanged) position during the same tracking cycle, each shot is carried out while performing shifting from a control grid 27 (a pixel 36) to another control grid 27 (another pixel 36) by the deflector 209. Then, after finishing one tracking cycle and returning the tracking position of the irradiation region 34, the first shot position is adjusted to the position shifted by, for example, one control grid (one pixel) as shown in the lower part of FIG. 19, and each shot is performed shifting from one control grid (one pixel) to another control grid (another pixel) by the deflector 209 while executing a next tracking control. By repeating this operation during writing the stripe region 32, the position of the irradiation region 34 is shifted sequentially, such as from 34a to 34o, to perform writing of the stripe region concerned.

Based on the writing sequence, it is determined which beam of the multiple beams irradiates which control grid 27 (pixel 36) on the target object 101. Supposing that the sub-irradiation region 29 is a region composed of n×n pixels, n control grids (n pixels) are written by one tracking operation. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other sub-irradiation regions 29 each composed of n×n pixels in the irradiation region of multiple beams, the same operation is executed at the same time so as to perform writing similarly.

As described above, according to the first embodiment, the projection amount of the crystal 10 projecting from the upper surface of the holding part 12 can be controlled with a high accuracy. Accordingly, it is possible to extend the life of the cathode mechanism 222 by which a desired brightness distribution can be acquired. Therefore, the down time of the writing apparatus 100 can be reduced.

Embodiments have been explained referring to specific examples described above. However, the present invention is not limited to these specific examples.

While the apparatus configuration, control method, and others not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

Further, any other cathode mechanism of electron emission sources, electron emission source, and electron beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cathode mechanism of an electron emission source comprising:
    a crystal including an upper part whose shape is one of a column, a truncated cone, and a combined shape of them, and which has a first surface to emit thermoelectrons by heating, and a lower part, integrated with the upper part, which has a second surface being substantially parallel to the first surface, and having a diameter size larger than a maximum diameter size of the upper part;
    a holding part configured to be a column having, in order from a side of an upper surface of the holding part, a plurality of different inner diameters of a first diameter size and a second diameter size larger than the first diameter size, and to hold the crystal in a state where the first surface of the crystal is projecting from the upper surface, and the second surface of the crystal contacts the holding part inside the column; and
    a retaining part configured to retain the crystal, at a back side of the lower part of the crystal, not to be separated from the holding part,
    wherein, inside the holding part, an opening part is formed in one of a manner where a diameter size of the opening part is the first diameter size, from the upper surface to a midway height position, and a manner where the diameter size of the opening part increases, downward from the upper surface, in a reverse-tapered state to become, at the midway height position, the first diameter size, and further, the opening part is formed in a manner where the diameter size of the opening part is the second diameter size larger than the first diameter size, from the midway height position to a back side of the holding part.

2. The mechanism according to claim 1, wherein a projection amount of the first surface projecting from the upper surface of the holding part is at most 10% of a diameter of the first surface.

3. The mechanism according to claim 1, wherein the holding part and the retaining part are formed by a same material.

4. The mechanism according to claim 1, further comprising:
- a first supporting post configured to support the holding part and extend with keeping a same section size; and
- a second supporting post configured to support the holding part and extend with keeping a same section size.

5. The mechanism according to claim 4, wherein the first supporting post and the second supporting post are arranged, facing each other, to form a space therebetween whose width size is either one of the second diameter size and a diameter size larger than the second diameter size.

6. The mechanism according to claim 4, further comprising:
- a first base part configured to support the first supporting post; and
- a second base part configured to support the second supporting post.

7. The mechanism according to claim 6, wherein
one end of the first supporting post is connected to the holding part and another end is connected to the first base part, and
one end of the second supporting post is connected to the holding part and another end is connected to the second base part.

8. The mechanism according to claim 6, wherein the holding part, the first supporting post, the second supporting post, the first base part, and the second base part are formed in an integrated structure by a same material.

* * * * *

UNITED STATES PATENT AND TRADEMARK OFFICE
CERTIFICATE OF CORRECTION

| | | |
|---|---|---|
| PATENT NO. | : 12,106,928 B2 | Page 1 of 1 |
| APPLICATION NO. | : 17/938466 | |
| DATED | : October 1, 2024 | |
| INVENTOR(S) | : Ryoei Kobayashi | |

It is certified that error appears in the above-identified patent and that said Letters Patent is hereby corrected as shown below:

On the Title Page

Item (72) should read:
- (72) Inventor: Ryoei Kobayashi, Yokohama (JP) -

Signed and Sealed this
Sixth Day of May, 2025

Coke Morgan Stewart
*Acting Director of the United States Patent and Trademark Office*